(12) United States Patent
Shin et al.

(10) Patent No.: US 12,193,298 B2
(45) Date of Patent: Jan. 7, 2025

(54) ORGANIC LIGHT EMITTING DISPLAY APPARATUS

(71) Applicant: LG Display Co., Ltd., Seoul (KR)

(72) Inventors: HyeonHoon Shin, Paju-si (KR); Heejae Park, Paju-si (KR); Taehoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 440 days.

(21) Appl. No.: 17/548,198

(22) Filed: Dec. 10, 2021

(65) Prior Publication Data
US 2022/0190053 A1 Jun. 16, 2022

(30) Foreign Application Priority Data
Dec. 11, 2020 (KR) .................. 10-2020-0173478

(51) Int. Cl.
*H10K 59/35* (2023.01)
*H10K 50/844* (2023.01)
*H10K 59/38* (2023.01)

(52) U.S. Cl.
CPC ......... *H10K 59/35* (2023.02); *H10K 50/8445* (2023.02); *H10K 59/38* (2023.02)

(58) Field of Classification Search
CPC ..... H10K 50/8445; H10K 59/35; H10K 59/38
USPC ....................................................... 257/40
See application file for complete search history.

(56) References Cited

U.S. PATENT DOCUMENTS

| | | | |
|---|---|---|---|
| 9,065,076 B2 | 6/2015 | Lee et al. | |
| 2014/0312325 A1* | 10/2014 | Jang | H10K 59/873 |
| | | | 257/40 |
| 2015/0137081 A1 | 5/2015 | Kim et al. | |
| 2015/0187847 A1 | 7/2015 | Choi | |
| 2016/0064694 A1* | 3/2016 | Choi | H10K 59/8792 |
| | | | 257/40 |
| 2016/0308162 A1 | 10/2016 | Yoo et al. | |
| 2018/0005574 A1 | 1/2018 | Kim et al. | |
| 2019/0043931 A1* | 2/2019 | Yim | H10K 59/35 |
| 2019/0296264 A1* | 9/2019 | Mathai | H10K 50/852 |
| 2019/0355793 A1 | 11/2019 | Oh et al. | |
| 2020/0212130 A1* | 7/2020 | Kim | H10K 50/818 |
| 2020/0373518 A1 | 11/2020 | Lee et al. | |
| 2021/0050388 A1* | 2/2021 | Song | H10K 50/865 |
| 2021/0359274 A1* | 11/2021 | Kim | H10K 50/844 |
| 2021/0399068 A1* | 12/2021 | Kim | H10K 59/8792 |

FOREIGN PATENT DOCUMENTS

| | | |
|---|---|---|
| CN | 107946476 A | 4/2018 |
| CN | 108122953 A | 6/2018 |
| CN | 109728040 A | 5/2019 |
| CN | 111384104 A | 7/2020 |
| EP | 3633750 A1 | 4/2020 |
| JP | 2005-274741 A | 10/2005 |
| JP | 2011-54526 A | 3/2011 |
| JP | 2012-38631 A | 2/2012 |
| JP | 2013-16271 A | 1/2013 |

(Continued)

*Primary Examiner* — Igwe U Anya
(74) *Attorney, Agent, or Firm* — Birch, Stewart, Kolasch & Birch, LLP

(57) ABSTRACT

An organic light emitting display apparatus includes an organic light emitting device provided in each of a plurality of subpixels, and a color shift prevention structure on the organic light emitting device.

13 Claims, 3 Drawing Sheets

(56) References Cited

FOREIGN PATENT DOCUMENTS

| | | |
|---|---|---|
| JP | 2017-10809 A | 1/2017 |
| JP | 2020-109753 A | 7/2020 |
| JP | 7378454 B2 | 11/2023 |
| KR | 10-2013-0008660 A | 1/2013 |
| KR | 10-2019-0131635 A | 11/2019 |
| KR | 10-2044923 B1 | 11/2019 |
| TW | 201347171 A | 11/2013 |
| TW | 201507138 A | 2/2015 |
| WO | WO 2011/145174 A1 | 11/2011 |

\* cited by examiner

ORGANIC LIGHT EMITTING DISPLAY APPARATUS

CROSS-REFERENCE TO RELATED APPLICATIONS

This application claims priority to Korean Patent Application No. 10-2020-0173478 filed in the Republic of Korea on Dec. 11, 2020, the entire contents of which are hereby expressly incorporated by reference as if fully set forth herein into the present application.

BACKGROUND

Field of the Invention

The present disclosure relates to an organic light emitting display apparatus.

Discussion of the Related Art

Image display apparatuses for displaying various information on a screen are main technology of information and communication technology and are advancing to be thin, lightweight, and portable and to have high performance. Therefore, organic light emitting display apparatuses which control the amount of light emitted from an organic light emitting device to display an image are attracting much attention.

Organic light emitting devices are self-emitting devices including a thin light emitting layer between electrodes and are possible to be implemented as a thin film. General organic light emitting display apparatuses have a structure where a pixel driving circuit and an organic light emitting device are formed on a substrate, and light emitted from the organic light emitting device passes through a substrate or a barrier layer, thereby displaying an image.

Since the organic light emitting display apparatuses are implemented without a separate light source device, the organic light emitting display apparatuses can be easily implemented as a flexible display apparatus. In this case, a flexible material such as plastic or metal foil can be used as a substrate of the organic light emitting display apparatus.

SUMMARY OF THE DISCLOSURE

Accordingly, the present disclosure is directed to providing an organic light emitting display apparatus that substantially obviates one or more problems due to limitations and disadvantages of the related art.

Organic light emitting display apparatuses are advancing to provide the best user experience on the basis of an environment. Particularly, organic light emitting display apparatuses are being designed so that a user feels the highest image quality under various environments and use conditions.

An aspect of the present disclosure is directed to providing an organic light emitting display apparatus which enhances the image quality of the organic light emitting display apparatus.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including an organic light emitting device provided in each of a plurality of subpixels and a color shift prevention structure on the organic light emitting device.

The color shift prevention structure can include a first capping layer on the organic light emitting device and a second capping layer on the first capping layer, and the second capping layer can be differently provided for each of the plurality of subpixels.

The first capping layer can be an organic film, and the second capping layer can be an inorganic film.

The first capping layer can contact an upper portion of a cathode of the organic light emitting device.

The second capping layer can have the same shape as a shape of an anode of the organic light emitting device.

An area of the second capping layer can be 50% to 90% of an area of the anode.

The second capping layer can have an area which is enlarged as a wavelength of light emitted from a corresponding subpixel is shortened.

An area of a second capping layer corresponding to a subpixel emitting blue light can be larger than an area of a second capping layer corresponding to a subpixel emitting green light, and the area of the second capping layer corresponding to the subpixel emitting the green light can be larger than an area of a second capping layer corresponding to a subpixel emitting red light.

The second capping layer can be semispherical.

An interface between the first capping layer and the second capping layers has roughness having a certain value or more.

The display apparatus can include a first region including a subpixel, where the second capping layer is not disposed at an upper portion thereof, at a first ratio and a second region including a subpixel, where the second capping layer is not disposed at an upper portion thereof, at a second ratio, and the second ratio is greater than the first ratio.

A second viewing angle, at which a user looks at the second region, can be greater than a first viewing angle at which the user looks at the first region.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

Figure 1:
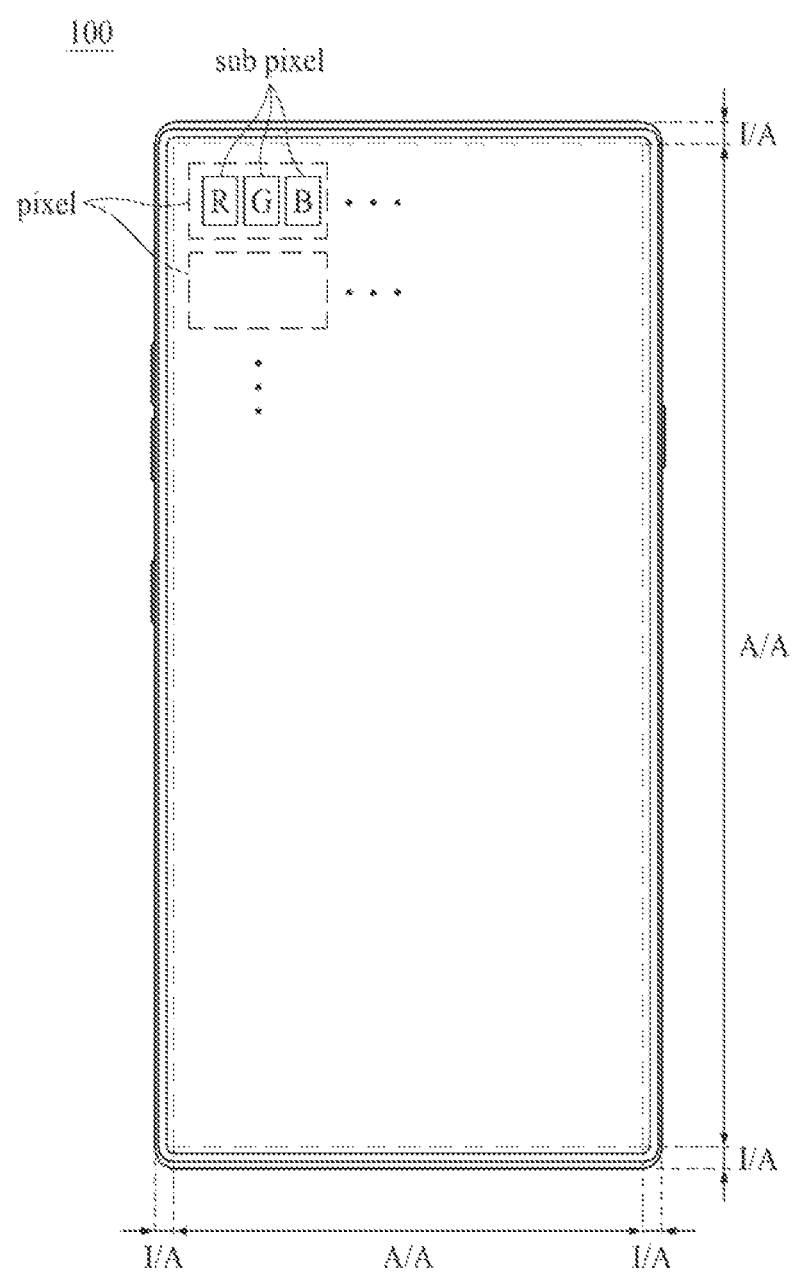
FIG. 1 is a plan view illustrating an organic light emitting display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF THE EMBODIMENTS

Reference will now be made in detail to the exemplary embodiments of the present disclosure, examples of which are illustrated in the accompanying drawings. Wherever possible, the same reference numbers will be used throughout the drawings to refer to the same or like parts.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part can be added unless "only" is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case that is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

In describing elements of the present disclosure, the terms "first," "second," "A," "B," "(a)," "(b)," etc. can be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings.

FIG. 1 is a plan view illustrating an organic light emitting display apparatus 100 according to an embodiment of the present disclosure. Further, all components of each organic light emitting display apparatus according to all embodiments of the present disclosure are operatively coupled and configured.

Referring to FIG. 1, the organic light emitting display apparatus 100 can include at least one active area A/A, and an array of a plurality of pixels can be disposed in the at least one active area. Each of the plurality of pixels can include a plurality of subpixels. In this case, a subpixel can be a minimum unit for displaying one color. One subpixel circuit can include a plurality of transistors, a capacitor, and a plurality of lines. The subpixel circuit can be configured with two transistors and one capacitor (2T1C), but is not limited thereto and can be implemented as a subpixel circuit to which 4T1C, 7T1C, or 6T2C is applied. Further, the subpixel can be implemented to be suitable for the organic light emitting display apparatus 100 having a top emission type.

One or more inactive areas I/A can be disposed near the active area. For example, the inactive area can be adjacent to at least one of sides of the active area. In FIG. 1, the inactive area can surround the active area having a tetragonal shape. However, a shape of the active area and the shape and arrangement of the inactive area adjacent to the active area are not limited to an example illustrated in FIG. 1. The active area and the inactive area can have a shape suitable for a design or need of an electronic device equipped with the organic light emitting display apparatus 100. An example of the shape of the active area can include a pentagonal shape, a hexagonal shape, a circular shape, an oval shape, etc.

Each pixel of the active area A/A can be associated with a pixel circuit. The pixel circuit can include one or more switching transistors and one or more driving transistors. Each pixel circuit can be electrically connected to signal lines (a gate line, a data line, etc.) for communicating with a gate driver and a data driver, which are disposed in the inactive area.

The gate driver and the data driver can be implemented with a thin film transistor (TFT) in the inactive area I/A. Such a driver can be referred to as a gate-in panel (GIP). Further, some elements such as a data driver integrated circuit (IC) can be mounted on a separated printed circuit board (PCB) and can be coupled to an interface (a pad, a bump, a pin, etc.) disposed in the inactive area by using a circuit film such as a flexible printed circuit board (FPCB), a chip-on film (COF), or a tape carrier package (TCP). The circuit film (the COF, the PCB, etc.) can be disposed on a rear surface of the organic light emitting display apparatus 100.

The organic light emitting display apparatus 100 can include various additional elements for generating various signals or driving a pixel in the active area. The additional elements for driving the pixel can include an inverter circuit, a multiplexer, and an electrostatic discharge (ESD) circuit. The organic light emitting display apparatus 100 can include an additional element associated with a function other than pixel driving. For example, the organic light emitting display apparatus 100 can include a plurality of additional elements for providing a touch sensing function, a user authentication function (for example, fingerprint recognition), a multi-level pressure sensing function, a tactile feedback function. The above-describe additional elements can be disposed in an external circuit connected to the connection interface and/or the inactive area.

Figure 2:
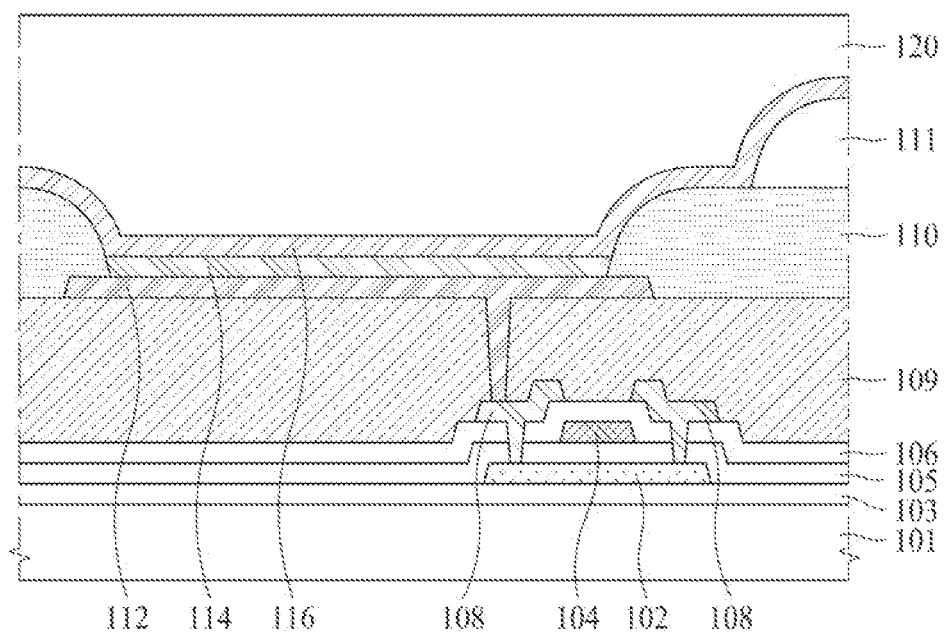
FIG. 2 is a cross-sectional view illustrating a portion of an active area of an organic light emitting display apparatus according to an embodiment of the present disclosure.

FIG. 2 is a cross-sectional view illustrating a portion of an active area of an organic light emitting display apparatus 100 according to an embodiment of the present disclosure.

Referring to FIG. 2, the organic light emitting display apparatus 100 can include a substrate 101, a thin film transistor (TFT), an organic light emitting device, and various function layers.

The substrate 101 can support and protect elements of the organic light emitting display apparatus 100 disposed thereon. The substrate 101 can be a flexible substrate including a ductile material having a flexible characteristic. The substrate 101 can be a glass or plastic substrate. When the substrate 101 is a plastic substrate, the substrate 101 can include a polyimide-based material or a polycarbonate-based material, and thus, can have flexibility. Particularly, polyimide can be applied to a high temperature process and can be a material capable of coating, and thus, can be much used as a plastic substrate.

A buffer layer 103 can be a function layer for protecting electrodes/lines from impurities such as alkali ions leaked from the substrate 101 or lower layers. The buffer layer can include silicon oxide (SiOx), silicon nitride (SiNx), or a multilayer thereof. The buffer layer 103 can include a multi-buffer layer and/or an active buffer layer. The multi-buffer can be formed by alternately stacking SiNx and SiOx and can suppress the diffusion of water and/or oxygen penetrating into the substrate 101. The active buffer can protect a semiconductor layer 102 of a transistor and can prevent various kinds of defects caused by particles penetrating through the substrate 101. The active buffer can include amorphous silicon (a-Si).

The TFT can include a gate electrode 104, a source and drain electrode 108, and a semiconductor layer 102. The semiconductor layer 102 can include amorphous silicon or polycrystalline silicon. Polycrystalline silicon can have excellent mobility, and thus, can be low in energy consumption power and good in reliability. Recently, an oxide semiconductor can have excellent mobility and uniformity, and thus, can attract much attention. The semiconductor layer 102 can include a source region, a drain region, and a channel between the source region and the drain region, which include p-type or n-type impurities and can include a low concentration doping region between a source region and a drain region adjacent to the channel.

A gate insulation layer 105 can be an insulation layer which includes a single layer or a multilayer, including SiOx or SiNx and can be provided so that a current flowing in the semiconductor layer 102 does not flow to a gate electrode 104.

The gate electrode 104 can act as a switch which turns on or off a TFT on the basis of an electrical signal transferred from the outside through a gate line. The gate electrode 104 can include conductive metal, and for example, can include a single layer or a multilayer which includes copper (Cu), aluminum (Al), molybdenum (Mo), chromium (Cr), gold (Au), titanium (Ti), nickel (Ni), and/or neodymium (Nd), or an alloy thereof. The source and drain electrode 108 can be connected to a data line and can allow an electrical signal transferred from the outside to be transferred from the TFT to the organic light emitting device. The source and drain electrode 108 can include conductive metal, and for example, can include a single layer or a multilayer which includes a metal material such as copper (Cu), aluminum (Al), molybdenum (Mo), chromium (Cr), gold (Au), titanium (Ti), nickel (Ni), and/or neodymium (Nd), or an alloy thereof.

An interlayer insulation layer 106 including a single layer or a multilayer including SiOx or SiNx can be disposed between the gate electrode 104 and the source and drain electrode 108, so as to insulate the gate electrode 104 from the source and drain electrode 108.

A passivation layer including an inorganic insulation layer such as SiOx or SiNx can be disposed on the TFT. The passivation layer can prevent an undesired electrical connection between elements of the TFT and can prevent pollution or damage from the outside. The passivation layer can be omitted based on the configuration and characteristic of each of the TFT and the organic light emitting device.

For convenience of description, only a driving TFT among various TFTs is illustrated, but a switch TFT and a capacitor can be included in the active area. When a signal is applied through the gate line, the switching TFT can transfer a signal, supplied through the data line, to a gate electrode of the driving TFT. The driving TFT can transfer a current, transferred through a power line by a signal transferred from the switching TFT, to an anode, and emitting of light can be controlled based on the current transferred to the anode.

A planarization layer 109 can be disposed on the TFT. The planarization layer 109 can protect the TFT, reduce a step height occurring due to the TFT, and decrease a parasitic capacitance occurring between the TFT, the gate line, the data line, and the organic light emitting device. The planarization layer 109 can include one or more materials of acrylic resin, epoxy resin, phenolic resin, polyamides resin, polyimides resin, unsaturated polyesters resin, polyphenylene resin, polyphenylenesulfides resin, and benzocyclobutene (BCB).

The organic light emitting device can be disposed on the planarization layer 109. The organic light emitting device can include an anode 112, a light emitting unit 114, and a cathode 116. The organic light emitting device can be configured in a single emission structure which emit one piece of light, or can be configured in a structure where a plurality of light emitting units are stacked to emit white light. In a case where the organic light emitting device emits white light, a color filter can be further provided. The anode 112 can be disposed just on the planarization layer 109. The anode 112 can be an electrode which supplies a hole to the light emitting unit 114 and can be electrically connected to the TFT through a contact hole which is in the planarization layer 109. The anode 112 can include indium tin oxide (ITO) or indium zinc oxide (IZO). In a case where the organic light emitting display apparatus 100 has a top emission type where light is emitted upward, the anode 112 can further include a reflection layer so that emitted light is more smoothly discharged in a direction toward an upper portion at which the cathode 116 is disposed. The anode 112 can have a two-layer structure where a transparent conductive layer including a transparent conductive material and a reflection layer are sequentially stacked, or can have a three-layer structure where a transparent conductive layer, a reflection layer, and a transparent conductive layer are sequentially stacked. The reflection layer can include silver (Ag) or an alloy including Ag.

A bank 110 can be disposed on the anode 112 and the planarization layer 109 and can define a region which actually emits light. The bank 110 can be formed by a photolithography process after a photoresist is formed on the anode 112. The photoresist can denote photosensitive resin where a solubility corresponding to a developer is changed by an action of light, and a specific pattern can be obtained by exposing and developing the photoresist.

A fine metal mask (FMM) which is a deposition mask can be used for forming the light emitting unit 114 of the organic light emitting device. In this case, a spacer 111 including one of polyimide, photo acryl, and BCB which are organic materials can be disposed on the bank 110, so as to prevent damage caused by contacting the deposition mask disposed on the bank 110 and to maintain a certain distance between the bank 110 and the deposition mask.

The light emitting unit 114 can be disposed between the anode 112 and the cathode 116. The light emitting unit 114 can emit light and can include at least one of a hole injection layer (HIL), a hole transport layer (HTL), a light emitting layer (EML), an electron transport layer (ETL), and an electron injection layer (EIL). Elements of the light emitting unit 114 can be omitted based on a structure or a characteristic of the organic light emitting display apparatus 100.

The cathode 116 can be disposed on the light emitting unit 114 and can supply an electron to the light emitting unit 114. The cathode 116 should or can supply an electron, and thus, can include a metal material such as magnesium (Mg) or silver-magnesium (Ag:Mg) which is a conductive material having a low work function. In a case where the organic light emitting display apparatus 100 has the top emission type, the cathode 116 can include transparent conductive oxide such as ITO, IZO, indium tin zinc oxide (ITZO), zinc oxide (ZnO), or tin oxide (TiO).

An encapsulation layer 120 for preventing oxidization or damage caused by water, oxygen, or impurities flowing in from the outside can be disposed on the organic light emitting device. The encapsulation layer 120 can be formed by stacking a plurality of inorganic material layers, a particle compensation layer, and a plurality of barrier films. The inorganic material layer can be disposed on a whole top surface of the organic light emitting device and can include SiNx or oxide aluminum (AlyOz) which is an inorganic material. An inorganic material layer can be further stacked and disposed on the particle compensation layer. The particle compensation layer can be disposed on the inorganic material layer and can use silicon oxycarbon (SiOCz), acryl, or epoxy resin which is an organic material. When a defect occurs due to a crack caused by foreign materials or particles occurring in performing a process, the particle compensation layer can cover a flection and particles to compensate for the flection and the particles.

A touch electrode (panel), a polarization film, and cover glass can be further disposed on the encapsulation layer 120.

Figure 3:
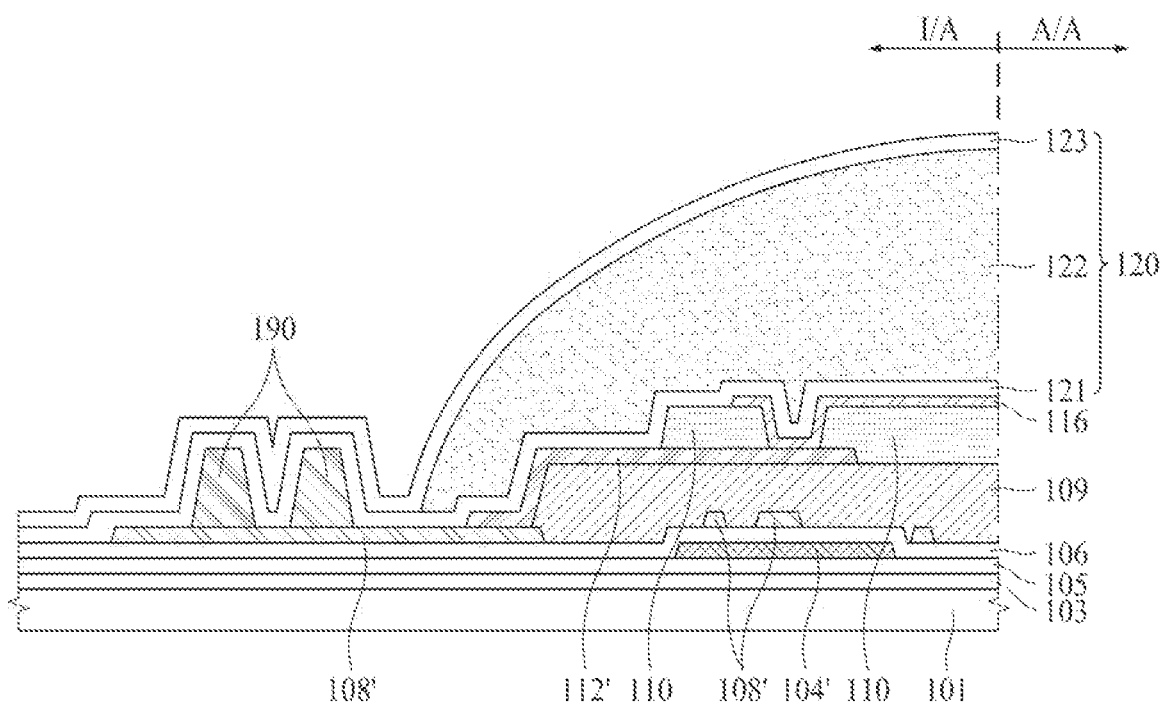
FIG. 3 is a diagram illustrating a portion of an inactive area of an organic light emitting display apparatus according to an embodiment of the present disclosure.

FIG. 3 is a diagram illustrating a portion of an inactive area of an organic light emitting display apparatus according to an embodiment of the present disclosure.

The inactive area I/A, as illustrated in FIG. 1, can be disposed outside the active area A/A, and a driving circuit (for example, a GIP) and a power line can be disposed thereon. Although the pixel circuit and the light emitting device are not disposed in the inactive area I/A, there can be the substrate 101 the buffer layer 103, gate insulation layer 105, and planarization layer 109 (the buffer layer 103, gate insulation layer 105. And planarization layer 109 may be referred as organic/inorganic function layers). Further, materials included in the elements of the active area A/A can be disposed for different use in the inactive area I/A. For example, the same metal 104' as that of a gate electrode 104 of the TFT or the same metal as that of a source/drain electrode 108 of the TFT in the active area can be disposed for lines or electrodes in the inactive area I/A. Furthermore, the same metal as that of one electrode (for example, an anode 112) of an organic light emitting diode can be disposed for lines or electrodes in the inactive area I/A.

The encapsulation layer 120 can cover an upper portion of the organic light emitting device. The encapsulation layer 120 can include an inorganic film which includes glass, metal, oxide aluminum (AlOx), or a silicon-based material, or can have a structure where an organic film and an inorganic film are alternately stacked. A plurality of inorganic films 121 and 123 can prevent the penetration of water or oxygen, and the organic film 122 can planarize a surface of the inorganic film 121.

The organic film 122 can have certain flowability, and thus, can flow to an outer portion of the inactive region in performing a coating process. Therefore, a dam 190 (may also be referred as blocking structure) can be disposed to prevent the organic film 122 from spreading to the inactive area I/A. In FIG. 3, it is illustrated that two blocking structures (dams) are provided, but the number of dams can be changed. Further, the dam 190 can be disposed to surround the active area A/A, or can be disposed in the active area A/A. The dam 190 can be formed of a multilayer by using one or more materials. For example, the dam 190 can include a material which is used to form the planarization layer 109, the bank 110, and the spacer 111.

Various circuits and electrodes/lines disposed in the inactive area I/A can include a gate metal 104' and/or a source/drain metal 108'. In this case, the gate metal 104' can be formed of the same material as that of the gate electrode of the TFT through the same process, and the source/drain metal 108' can be formed of the same material as that of the source/drain electrode of the TFT through the same process.

For example, the source/drain metal 108' can be used as a power (for example, a low level power VSS and a high level power VDD) line. In this case, the source/drain metal 108' can be connected to a metal layer 112' (or may be referred as metal), and the cathode 116 of the organic light emitting diode can be supplied with a power through a connection with the source/drain metal 108' and the metal layer 112'. The metal layer 112' can contact the source/drain metal 108', extend along an outermost sidewall of the planarization layer 109, and contact the cathode 116 at a portion on the planarization layer 109. The metal layer 112' can be a metal layer which is formed of the same material as that of the anode 112 of the organic light emitting diode through the same process.

Figure 4:
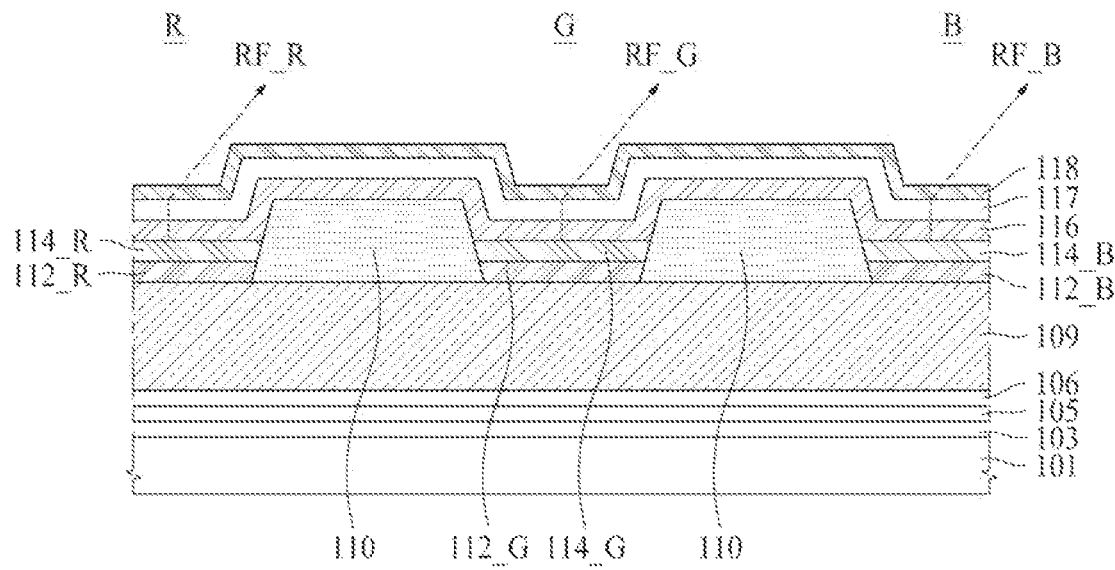
FIG. 4 is a diagram illustrating subpixels of an organic light emitting display apparatus according to an example of the present disclosure.

FIG. 4 is a diagram illustrating subpixels of an organic light emitting display apparatus according to an embodiment of the present disclosure.

In an organic light emitting display apparatus according to a related art, a cathode can be oxidized by oxygen and/or water flowing in from the outside. Further, a diffuse reflection can occur due to external light, and thus, light efficiency can be reduced.

In order to address this limitation associated with the related art, the organic light emitting display apparatus of FIG. 4 according to the embodiment of the present disclosure can further include a capping layer on the cathode 116. The capping layer may include an organic film 117 and an inorganic film 118. The capping layer including the organic film 117 and the inorganic film 118 can be formed of an organic film and/or an inorganic film. In FIG. 4, an example is illustrated where the capping layer may be implemented with the organic film 117 and the inorganic film 118 on the cathode 116. The organic film 117 can include an organic material having a high refractive index. Further, the inorganic film 118 can have a refractive index which differs from that of the organic film 117.

On the other hand, the inventors have recognized issues which may arise in the light emitting layer structure illustrated in FIG. 4. One issue may be a case where a color shift based on a viewing angle may occur as the size of a display apparatus increases, even with the capping layer having the structure illustrated in FIG. 4. As such, in a display apparatus, a color sense difference based on a viewing angle may largely occur. Particularly, in a display apparatus which is horizontally long like automotive display apparatuses (e.g., display devices disposed inside vehicles), an image quality difference recognized by a driver may be large because a viewing angle difference between a portion close to a driver seat and a portion far away from the driver seat.

The inventors have recognized such issues, and thus, invented a structure for effectively decreasing a recognized image quality change caused by a viewing angle. An example of such structure will be discussed below in reference to FIG. 5.

Figure 5:
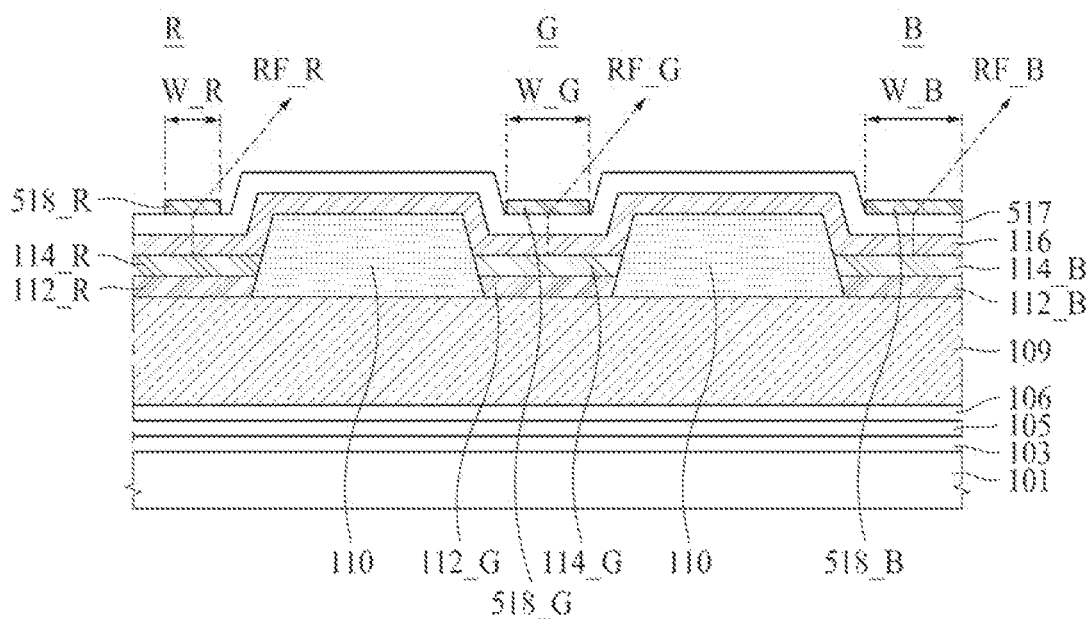
FIG. 5 is a diagram illustrating subpixels of an organic light emitting display apparatus according to another example of the present disclosure.

FIG. 5 is a diagram illustrating subpixels of an organic light emitting display apparatus according to another embodiment of the present disclosure. The organic light emitting display apparatus of FIG. 5 can include the same or similar components as those of FIGS. 1-4, as seen by the same reference numerals.

As such, regarding the elements of FIG. 5, repeated descriptions of those same (or similar) elements as the elements of FIGS. 1 to 4 are omitted or can be briefly provided. For instance, the organic light emitting display apparatus of FIG. 5 can include the organic light emitting device of FIGS. 1-4, which can include the anode 112, the light emitting unit 114, and the cathode 116.

Particularly, referring to FIG. 5, the organic light emitting display apparatus according to this embodiment of the present disclosure can include a structure which prevents color shift caused by a viewing angle. Here, the phrase 'structure' is not limited to a structure, but can refer to a material, material(s), layer(s), pattern(s), or a combination of any of these elements.

According to this embodiment, the color shift prevention structure can be obtained by optimizing or varying the shape and arrangement of a capping layer which covers an upper portion of the organic light emitting device. As such, the color shift preventing structure includes the capping layer of FIG. 5. The capping layer of FIG. 5 can be provided to adjust an optical characteristic and can include a first capping layer 517 on the organic light emitting device (e.g., the anode 112, the light emitting unit 114, and the cathode 116) and a plurality of second capping layers 518_R, 518_G, and 518_B on the first capping layer 517. For example, the first capping layer 517 can be disposed on the cathode 116 of the organic light emitting device.

In one example, the organic light emitting display apparatus according to this embodiment of the present disclosure can include the organic light emitting device (e.g., the anode 112, the light emitting unit 114, and the cathode 116) included in each of a plurality of subpixels R, G, and B, and the color shift prevention structure on the organic light emitting device. Each of the subpixels R, G, and B can further include a driving circuit, a line, and an electrode, in addition to a plurality of organic light emitting display device including the anode 112, the light emitting unit 114, and the cathode 116.

The color shift prevention structure can protect the organic light emitting device and can increase light extraction efficiency. Further, the color shift prevention structure can decrease a deterioration in color sense caused by a viewing angle. The color shift prevention structure can include the first capping layer 517 on the organic light emitting device, and the plurality of second capping layers 518_R, 518_G, and 518_B on the first capping layer 517, where the second capping layers 518_R, 518_G, and 518_B can be differently provided for each of the subpixels R, G, and B. For example, the widths, lengths, sizes, and/or shapes of the second capping layers 518_R, 518_G, and 518_B can be different from each other.

The first capping layer 517 can be an organic film which includes organic oxide (for example, $SiO_2$). The first capping layer 517 can contact and directly cover an upper portion of the cathode 116. The first capping layer 517 can wholly have a uniform thickness, or can have a different thickness for each of the subpixels R, G, and B. For example, the widths, lengths, sizes, and/or shapes of the second capping layers 518_R, 518_G, and 518_B may be different from each other.

The second capping layer 518_R, 518_G, and 518_B 518 can be an inorganic film which includes fluoride lithium (LiF). The second capping layer 518 can be circular, oval, or polygonal, or can have the same shape as that of an anode 112 of the organic light emitting device. When the second capping layer 518 is disposed on the first capping layer 517, emission efficiency and color purity can increase based on the effect of a micro-cavity.

The degree of refraction of light emitted from a corresponding subpixel can be adjusted based on an area of the second capping layer 518. For example, as an area of the second capping layer 518 increases, the amount of refracted light can more increase, and light can be relatively more recognized in a direction (a viewing angle seen in front of a display apparatus is 0 degrees) in which a viewing angle is large. Further, the degree of refraction by the second capping layer can vary based on a wavelength of light, and light having a relatively longer wavelength can be more refracted. As a result, light having a relatively shorter wavelength can be largely deteriorated in luminance and/or color sense at a point at which a viewing angle is large.

Based on such principles, the second capping layers 518_R, 518_G, and 518_B can be configured so that a color-based recognition change at a point (at left and right side portions of a display apparatus), at which a viewing angle is large, is appropriately adjusted. Therefore, the second capping layers 518_R, 518_G, and 518_B can have an area which is enlarged as a wavelength of light emitted from each of corresponding subpixels R, G, and B is shortened. For example, an area of the second capping layer 518_B corresponding to the subpixel B emitting blue light can be wider than that of the second capping layer 518_G corresponding to the subpixel G emitting green light, and an area of the second capping layer 518_G corresponding to the subpixel G emitting the green light can be wider than that of the second capping layer 518_R corresponding to the subpixel R emitting red light. For example, an area of the second capping layer can be widened in the order of subpixels R, G, and B, according to a relationship of R<G<B. Based on such a configuration, at a side viewing angle at which pieces of refracted light RF_R, RF_G, and RF_B are much recognized, a luminance reduction rate for each pixel can be similar, and thus, a color sense difference between pixels can be reduced.

A shape of the second capping layer 518 can be variously provided. In a case where the second capping layer 518 has the same shape as that of the anode 114 of the organic light emitting device, the second capping layer 518 can be provided to have an area (for example, 50% to 90%) which is less than that of the anode 112. The anode 112 can have a different size and shape for each subpixel, and the second capping layer can have the same shape as that of the anode 112. Furthermore, an area of the second capping layer 518_B corresponding to the subpixel B emitting the blue light can be 90% of an anode 112_B, an area of the second capping layer 518_G corresponding to the subpixel G emitting the green light can be 70% of an anode 112_G, and an area of the second capping layer 518_R corresponding to the subpixel R emitting the red light can be 50% of an anode 112_R.

The second capping layers 518_R, 518_G, and 518_B can be formed in a semispherical shape and can function like a lens. Further, an interface between the first capping layer 517 and each of the second capping layers 518_R, 518_G, and 518_B can be implemented to be uneven without being flat and can increase refracted light. In the case where the interface is not flat, the interface can have roughness having a certain value or more.

The second capping layers 518_R, 518_G, and 518_B can be differently applied for each region of a display apparatus. For example, the organic light emitting apparatus can include a first region including at least one of the subpixels, where the second capping layers are disposed at an upper portion thereof, at a first ratio and a second region including a subpixel, where the second capping layers are is disposed at an upper portion thereof, at a second ratio. In this case, the second ratio can be different from the first ratio. For example, the second ratio can be greater than the first ratio. For example, only ½ of the subpixel in the first region can be provided with a second capping layer, and all of the subpixel in the second region can be provided with a second capping layer.

The first region can be a region closer to a user, and the second region can be a region farther away from the user. For example, a second viewing angle $\theta 2$ at which the user looks at the second region can be greater than a first viewing angle $\theta 1$ at which the user looks at the first region ($\theta 1 < \theta 2$). Based on such a structure, the display apparatus according to an embodiment of the present disclosure can more uniformly provide recognized image quality based on a viewing angle.

Based on the above-described structure, a degradation in recognized image quality based on a use environment (particularly, a viewing angle) can be prevented. Accordingly, the usability of an organic light emitting display apparatus can be enhanced. Such an advantage can be very useful for automotive display apparatuses which are horizontally long in length.

The embodiments of the present disclosure can provide an organic light emitting display apparatus for addressing a limitation where image quality may be degraded. In more detail, the embodiments of the present disclosure can reduce the adverse effect of a viewing angle of the organic light emitting display apparatus on image quality. Therefore, the organic light emitting display apparatus according to the embodiments of the present disclosure can be enhanced in usability in various environments.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. An organic light emitting display apparatus comprising:
   a display panel including a plurality of subpixels;
   an organic light emitting device provided in each of the plurality of subpixels; and
   a color shift prevention structure on the organic light emitting device, wherein the color shift prevention structure includes a first capping layer on the organic light emitting device and second capping layers on the first capping layer, and wherein the second capping layers are differently provided for each of the plurality of subpixels.

2. The organic light emitting display apparatus of claim 1 wherein the first capping layer is an organic film, and the second capping layers are an inorganic film.

3. The organic light emitting display apparatus of claim 1, wherein the first capping layer contacts an upper portion of a cathode of the organic light emitting device.

4. The organic light emitting display apparatus of claim 3, wherein the first capping layer directly covers the upper portion of the cathode of the organic light emitting device.

5. The organic light emitting display apparatus of claim 1, wherein the second capping layers have a same shape as a shape of an anode of the organic light emitting device.

6. The organic light emitting display apparatus of claim 5, wherein an area of the second capping layer is approximately 50% to 90% of an area of the anode of the organic light emitting device.

7. The organic light emitting display apparatus of claim 5, wherein an area of a second capping layers corresponding to a subpixel for emitting blue light is wider than an area of a second capping layers corresponding to a subpixel for emitting green light, and the area of the second capping layer corresponding to the subpixel for emitting the green light is wider than an area of a second capping layer corresponding to a subpixel for emitting red light.

8. The organic light emitting display apparatus of claim 1, wherein one of the second capping layers has an area which is enlarged as a wavelength of light emitted from a corresponding subpixel is shortened.

9. The organic light emitting display apparatus of claim 1, wherein the second capping layers are semispherical.

10. The organic light emitting display apparatus of claim 1, wherein an interface between the first capping layer and the second capping layers has a roughness.

11. The organic light emitting display apparatus of claim 1, wherein the organic light emitting apparatus includes a first region including at least one of the plurality of subpixels, where the second capping layers are disposed at an upper portion thereof, at a first ratio, and a second region including at least one of the plurality of subpixels, where the second capping layers are disposed at an upper portion thereof, at a second ratio, and wherein the second ratio is different from the first ratio.

12. The organic light emitting display apparatus of claim 11, wherein the second ratio is greater than the first ratio.

13. The organic light emitting display apparatus of claim 11, wherein a second viewing angle, at which a user looks at the second region, is greater than a first viewing angle at which the user looks at the first region.

* * * * *